US012696386B2

(12) United States Patent
Tang et al.

(10) Patent No.: US 12,696,386 B2
(45) Date of Patent: Jul. 28, 2026

(54) COPPER CLAD LAMINATE AND USES OF THE SAME

(71) Applicant: TAIWAN UNION TECHNOLOGY CORPORATION, Zhubei City (TW)

(72) Inventors: Jui-Hsiang Tang, Zhubei City (TW); Yun Hsing Sung, Zhubei City (TW)

(73) Assignee: TAIWAN UNION TECHNOLOGY CORPORATION, Zhubei City (TW)

( * ) Notice: Subject to any disclaimer, the term of this patent is extended or adjusted under 35 U.S.C. 154(b) by 199 days.

(21) Appl. No.: 18/413,942

(22) Filed: Jan. 16, 2024

(65) Prior Publication Data

US 2025/0056720 A1 Feb. 13, 2025

(30) Foreign Application Priority Data

Aug. 11, 2023 (TW) ................................ 112130345

(51) Int. Cl.
*H05K 1/03* (2006.01)

(52) U.S. Cl.
CPC ..... *H05K 1/036* (2013.01); *H05K 2201/0129* (2013.01); *H05K 2201/0141* (2013.01); *H05K 2201/015* (2013.01)

(58) Field of Classification Search
CPC ........... H05K 1/036; H05K 2201/0129; H05K 2201/0141; H05K 2201/015; H05K 3/022; H05K 3/386; H05K 1/0373; H05K 1/024; H05K 1/0366; H05K 1/056
See application file for complete search history.

(56) References Cited

U.S. PATENT DOCUMENTS

| | | | | |
|---|---|---|---|---|
| 5,218,030 | A | 6/1993 | Katayose et al. | |
| 5,352,745 | A | 10/1994 | Katayose et al. | |
| 6,352,782 | B2 | 3/2002 | Yeager et al. | |
| 6,995,195 | B2 | 2/2006 | Ishii et al. | |
| 2003/0121697 | A1 * | 7/2003 | Nagai | H05K 1/09 174/259 |
| 2016/0280913 | A1 | 9/2016 | Liu et al. | |

(Continued)

FOREIGN PATENT DOCUMENTS

| | | | |
|---|---|---|---|
| CN | 102774079 | A * | 11/2012 |
| JP | H05-029740 | A | 2/1993 |

(Continued)

OTHER PUBLICATIONS

Espacenet translation of CN-102774079-A (Year: 2025).*

(Continued)

*Primary Examiner* — Michael Zhang

(74) *Attorney, Agent, or Firm* — Greer, Burns & Crain, Ltd

(57) ABSTRACT

A copper clad laminate is provided. The copper clad laminate includes a dielectric layer; an adhesive layer, which is disposed on at least one side of the dielectric layer and formed of an adhesive material, wherein the adhesive material includes a non-perfluorinated resin; and a copper foil, wherein the copper foil has a first surface and is disposed on the other side of the adhesive layer opposite to the dielectric layer, and the copper foil is adhered to the adhesive layer with the first surface, wherein the first surface has a ten-point average roughness (Rz) of less than 0.5 μm, and the copper foil has a phosphorus content of no more than 499 $\mu g/dm^2$ at the first surface.

17 Claims, 1 Drawing Sheet

(56) References Cited

U.S. PATENT DOCUMENTS

| | | | | |
|---|---|---|---|---|
| 2019/0194505 | A1 | 6/2019 | Liu et al. | |
| 2021/0029823 | A1* | 1/2021 | Hosoi | B32B 15/20 |
| 2021/0307161 | A1* | 9/2021 | Neill | B32B 15/16 |

FOREIGN PATENT DOCUMENTS

| | | | | |
|---|---|---|---|---|
| JP | 2000-282265 | A | 10/2000 | |
| JP | 2019035051 | A * | 3/2019 | C08L 63/00 |

OTHER PUBLICATIONS

Espacenet translation of JP-2019035051-A (Year: 2025).*

Taiwan Office Action and Search Report received for Application No. 112130345, dated May 28, 2024.

Devahif, T., "Ultra Low Profile Copper Foil for Very Low Loss Material," Proceedings of SMTA International, Sep. 25-29, 2016, Rosemont, IL, pp. 888-893.

JX Advanced Metals, "Surface Treatment for Copper Foil," retrieved from the Internet: https://www.jx-nmm.com/english/products/copper_foil/rolled_copper_foil/surface_treatment.html on Dec. 3, 2025, 2 pages.

* cited by examiner

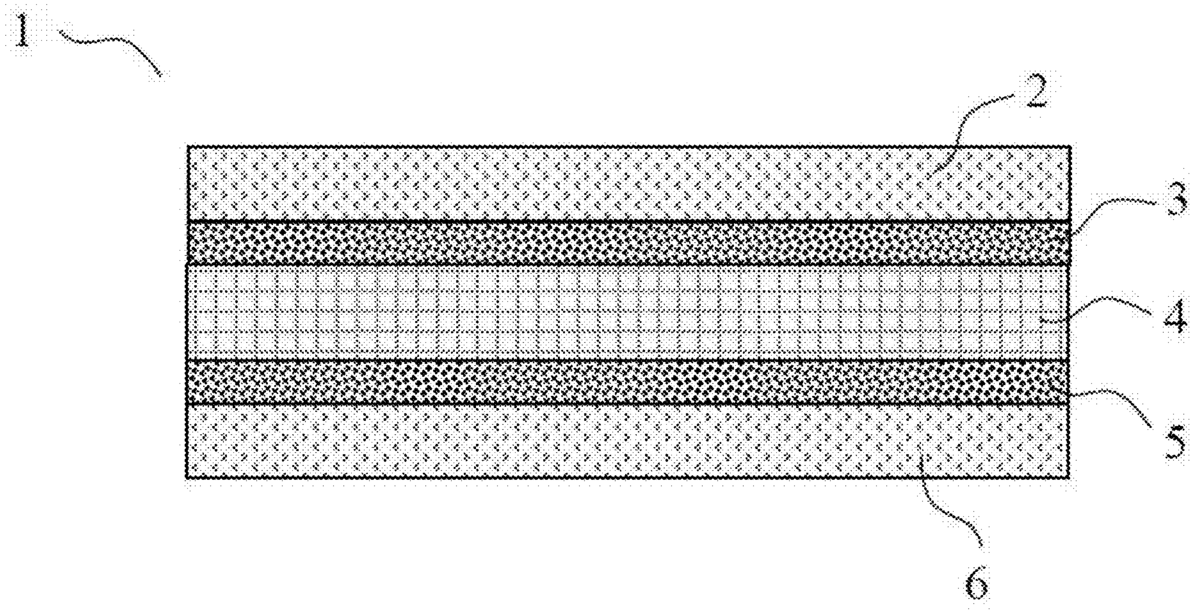
1
2
3
4
5
6

COPPER CLAD LAMINATE AND USES OF THE SAME

CLAIM FOR PRIORITY

This application claims the benefit of Taiwan Patent Application No. 112130345 filed on Aug. 11, 2023, the subject matter of which is incorporated by reference herein in its entirety.

BACKGROUND

Field of the Invention

The present invention provides a copper clad laminate, especially a copper clad laminate with specific roughness features and phosphorus content. The present invention also provides a printed circuit board prepared using the copper clad laminate.

Descriptions of the Related Art

Portable electronic products are continuously becoming highly functionalized and must be capable of processing vast amounts of information at high speeds. Consequently, base station signals have also become high-frequency, and the printed circuit boards suitable for high-frequency applications draw more and more attention. In order to transmit signals without compromising the quality of high-frequency signals, the industry is dedicated to reducing the high-frequency transmission loss of printed circuit boards.

The transmission loss of printed circuit boards can be primarily divided into two parts. One part arises from the conductor loss of copper foil, while the other part arises from the dielectric loss of insulating resin substrate. To reduce the dielectric loss of the insulating resin substrate, thermoplastic resins (such as a liquid crystal polymer resin or fluororesin) with low dielectric constant and low dielectric loss, as well as thermosetting resins (such as polyphenylene ether resin) with low dielectric constant and low dielectric loss, are commonly utilized in the market. However, conventional resins with low dielectric constant and low dielectric loss usually exhibit poor bonding with copper foil.

The reason behind the aforementioned problems lies in the fact that most low-dielectric resins are low-polarity resins with molecular structures that make it difficult to generate orientation polarization. This results in reduced intermolecular force at the interface between the insulating resin substrate and copper foil, preventing the establishment of chemical bonding. To enhance bonding at the interface between the insulating resin substrate and copper foil, prior art suggests altering the surface of copper foil to create an anchoring effect, such as roughening treatment like "attachment of fine copper grains" as disclosed in JP H05-029740 or "concave-convex formation via etching" as disclosed in JP 2000-282265 A. However, during signal transmission, the signal depth diminishes with increasing frequency, transmitting signals closer to the surface of copper foil. Therefore, subjecting the surface of the copper foil to the aforementioned roughening treatment would cause the signal to follow the surface irregularities of the copper foil, ultimately lengthening the transmission path of the signal.

To resolve the issue of increased signal transmission distance, prior methods suggest reducing the conductor resistance of copper foil. For example, this can be achieved by reducing the surface roughness of the initial copper foil or by reducing the intensity of roughening treatments. However, reducing the intensity of roughening treatments would weaken the anchoring effect, consequently reducing the physical bonding at the interface between the insulating resin substrate and copper foil.

Despite the prior art's recommendation of employing an adhesive layer between the insulating resin substrate and copper foil to address bonding issues, it remains challenging to achieve a copper clad laminate with both adhesive properties and suitable dielectric properties for high-frequency applications.

SUMMARY

Considering the aforementioned technical problems, the present invention provides a copper clad laminate, which comprises a copper foil with specific surface roughness and phosphorus content, an adhesive layer comprising a non-perfluorinated resin, and a dielectric layer, wherein a first surface with specific surface roughness and phosphorus content is the surface where the copper foil is in contact with the adhesive layer. The copper clad laminate of the present invention can have good peeling strength, thermal resistance and anti-aging property. Moreover, the copper clad laminate of the present invention is particularly suitable for high-frequency signal transmission.

Thus, an objective of the present invention is to provide a copper clad laminate, which comprises:

a dielectric layer;

an adhesive layer, which is disposed on at least one side of the dielectric layer and formed of an adhesive material, wherein the adhesive material comprises a non-perfluorinated resin; and a copper foil, wherein the copper foil has a first surface and is disposed on the other side of the adhesive layer opposite to the dielectric layer, and wherein the copper foil is adhered to the adhesive layer with the first surface, wherein the first surface has a ten-point average roughness (Rz) of less than 0.5 μm, and the copper foil has a phosphorus content of no more than 499 $\mu g/dm^2$ at the first surface.

In some embodiments of the present invention, based on the total number of atoms in the repeating unit(s) of the non-perfluorinated resin, the number of fluorine atoms in the non-perfluorinated resin is no more than 60%.

In some embodiments of the present invention, the copper foil has a phosphorus content of no more than 199 $\mu g/dm^2$ at the first surface.

In some embodiments of the present invention, the non-perfluorinated resin is selected from the group consisting of polychlorotrifluoroethylene, polyvinylidene difluoride, polyvinyl fluoride, an ethylene-tetrafluoroethylene copolymer, an ethylene-chloro-trifluoroethylene copolymer, and combinations thereof.

In some embodiments of the present invention, the dielectric layer comprises a dielectric material formed from a resin composition.

In some embodiments of the present invention, the resin composition comprises a thermosetting resin selected from the group consisting of an epoxy resin, a thermosetting phenolic resin with reactive functional groups, a thermosetting benzoxazine resin, a thermosetting polyphenylene ether resin, and combinations thereof.

In some embodiments of the present invention, the resin composition comprises a thermoplastic resin selected from the group consisting of a perfluorinated resin, a liquid crystal polymer, and a combination thereof. The perfluorinated resin can be selected from the group consisting of polytetrafluoroethylene, polyfluoroalkoxy alkane, fluorinated ethylene propylene, and combinations thereof.

In some embodiments of the present invention, the resin composition further comprises a component selected from the group consisting of a catalyst, an elastomer, a filler, a dispersing agent, a toughener, a viscosity modifying agent, a flame retardant, a plasticizer, a coupling agent, and combinations thereof.

Another objective of the present invention is to provide a printed circuit board, which is prepared from the aforementioned copper clad laminate.

To render the above objectives, technical features and advantages of the present invention more apparent, the present invention will be described in detail with reference to some embodiments hereinafter.

BRIEF DESCRIPTION OF THE DRAWINGS

FIG. 1 is a cross-sectional schematic view showing an embodiment of the copper clad laminate of the present invention.

DETAILED DESCRIPTION

Hereinafter, some embodiments of the present invention will be described in detail. However, the present invention may be embodied in various embodiments and should not be limited to the embodiments described in the specification.

Unless otherwise specified, the expressions "a," "the," or the like recited in the specification and in the claims should include both the singular and the plural forms.

Unless otherwise specified, the terms "first", "second" or similar expressions used in the specification and claims are employed solely for the purpose of distinguishing the depicted elements or components without any specific significance. Those terms are not intend to imply priority.

Unless otherwise specified, while describing the amount of the components in the solution, mixture, composition or varnish in the specification and in the claims, the weight of the solvent is not included.

Unless stated otherwise in the specification and claims, the term "the number of fluorine atoms" refers to the percentage of fluorine atoms within the repeating unit(s) of the fluororesin relative to the total number of atoms in the repeating unit(s). The unit used for the percentage of fluorine atoms in the repeating unit(s) of the fluororesin is %.

As used herein, the term "perfluorinated resin" refers to a fluorocarbon-based polymer containing over 60% of the number of fluorine atoms. The term "non-perfluorinated resin" refers to a fluorocarbon-based polymer containing no more than 60% of the number of fluorine atoms.

As used herein, the material of "copper foil" is pure copper with a purity of 99.5% or more.

The copper clad laminate of the present invention achieves enhanced peeling strength, improved thermal resistance and superior anti-aging properties through the combination of a copper foil with specific surface roughness and specific phosphorus content on a first surface (the surface attached to an adhesive layer), an adhesive layer comprising a non-perfluorinated resin, and a dielectric layer. Further details about the copper clad laminate and its applications are elaborated below.

1. COPPER CLAD LAMINATE

The copper clad laminate of the present invention comprises a dielectric layer, an adhesive layer disposed on at least one side of the dielectric layer, and a copper foil disposed on the other side of the adhesive layer opposite to the dielectric layer. In some embodiments of the present invention, the copper clad laminate essentially consists of the dielectric layer, the adhesive layer and the copper foil, or the copper clad laminate consists of the dielectric layer, the adhesive layer and the copper foil.

FIG. 1 shows a cross-sectional schematic view showing an embodiment of the copper clad laminate of the present invention. The copper clad laminate 1 comprises a dielectric layer 4, an adhesive layer 3 on the one side of the dielectric layer, another adhesive layer 5 on the other side of the dielectric layer, a copper foil 2 on the other side of the adhesive layer 3 opposite to the dielectric layer 4, and a copper foil 6 on the other side of the adhesive layer 5 opposite to the dielectric layer 4.

1.1. Dielectric Layer

The dielectric layer comprises, essentially consists of or consists of a dielectric material formed from a resin composition. The aforementioned dielectric layer can be manufactured by drying the resin composition to form a resin sheet. The method for preparing the resin sheet is not particularly limited and can follow conventional resin sheet manufacturing processes. For example, a colloidal group or slurry of the resin composition can firstly be prepared and subsequently formed into a sheet through methods such as roller forming, coating, die casting, or melt extrusion and subsequent roller forming. Afterwards, the sheet is dried at, for example, 90° C. to 170° C. for 1 (one) hour to 5 hours to remove solvent. The dried sheet is subjected to a calendering and sintering process to produce the final resin sheet. Calendering temperature can be 90° C. to 150° C., sintering temperature can be 300° C. to 400° C., and sintering time can be 20 minutes to 60 minutes.

The aforementioned resin sheet can alternatively be prepared through the following method. First, a colloid or slurry of the resin composition is prepared, then dried at, for example, 80° C. to 120° C. for 1 (one) hour to 5 hours to remove solvent. Subsequently, the dried colloid or slurry is formed into a sheet at 90° C. to 150° C. through roller forming, die casting, or melt extrusion and subsequent roller forming. Finally, the sheet is dried at 150° C. to 300° C. for 120 minutes to 240 minutes, resulting in the production of a resin sheet.

In some embodiments of the present invention, the resin sheet can comprise one or more reinforcing materials. A reinforcing material-comprising resin sheet can be manufactured by impregnating a reinforcing material with the resin composition or by coating the resin composition onto a reinforcing material and drying the impregnated or coated reinforcing material. The impregnating and coating methods include but are not limited to dipping, roller coating, die coating, bar coating, and spraying. Drying conditions can be 200° C. to 600° C. for 1 (one) minute to 30 minutes.

The types of reinforcing material are not particularly limited and encompass any conventional reinforcing material within the field. Generally, these reinforcing materials can include fibers selected from the group consisting of glass fibers, inorganic fibers other than glass fiber, and organic fiber. However, the scope of reinforcing materials are not limited to these categories. Examples of glass fibers include, but are not limited to, E-glass fibers, NE-glass fibers, S-glass fibers, L-glass fibers, D-glass fibers, T-glass fibers, Q-glass fibers, UN-glass fibers, and spherical glass. Examples of inorganic fibers other than glass fibers include, but are not limited to, quartz fibers. Examples of organic fibers include, but are not limited to, polyimide, polyamide, polyester, liquid crystal polyester, and polytetrafluoroethylene. The shape of the reinforcing material includes various forms such as woven fabric, non-woven fabric, roving, chopped strand mat, and surfacing mat, among others. For enhanced dimensional stability, preference is given to fabrics treated with super fiber opening and leveling processes as the reinforcing material. For enhanced moisture absorption thermal resistance, preference is given to glass fiber woven fabrics treated with surface treatment such as epoxy silane treatment, silane coupling agent treatment, and the like, as the reinforcing material. For enhanced electrical properties, preference is given to low-dielectric glass fiber fabrics as the reinforcing material. Examples of such low-dielectric glass fiber fabrics include glass fiber fabrics consist of glass fibers like L-glass, NE-glass, Q-glass, and similar variants.

The thickness of the dielectric layer is not particularly limited. Generally, the thickness of the dielectric layer can be 310 μm or less, preferably ranging from 250 μm to 310 μm. For example, the thickness of the dielectric layer can be 250 μm, 251 μm, 252 μm, 253 μm, 254 μm, 255 μm, 256 μm, 257 μm, 258 μm, 259 μm, 260 μm, 261 μm, 262 μm, 263 μm, 264 μm, 265 μm, 266 μm, 267 μm, 268 μm, 269 μm, 270 μm, 271 μm, 272 μm, 273 μm, 274 μm, 275 μm, 276 μm, 277 μm, 278 μm, 279 μm, 280 μm, 281 μm, 282 μm, 283 μm, 284 μm, 285 μm, 286 μm, 287 μm, 288 μm, 289 μm, 290 μm, 291 μm, 292 μm, 293 μm, 294 μm, 295 μm, 296 μm, 297 μm, 298 μm, 299 μm, 300 μm, 301 μm, 302 μm, 303 μm, 304 μm, 305 μm, 306 μm, 307 μm, 308 μm, 309 μm, or 310 μm, or within a range between any two of the values described herein.

1.1.1. Resin Composition

The resin composition used to form the dielectric material can comprise thermosetting resin(s) or thermoplastic resin(s). If the resin composition comprises thermosetting resin(s), it is referred to as a thermosetting resin composition. If the resin composition comprises thermoplastic resins, it is referred to as a thermoplastic resin composition. In addition, the resin composition for forming the dielectric material can optionally comprise other components to adaptively improve the workability of the resin composition during processing or improve the physicochemical properties of the electronic material prepared from the resin composition.

1.1.1.1. Thermosetting Resin

A thermosetting resin refers to a component which is gradually cured after being heated to form a network structure through a crosslinking reaction. Examples of thermosetting resin include but are not limited to an epoxy resin, a thermosetting phenolic resin with reactive functional groups, a thermosetting benzoxazine resin, and a thermosetting polyphenylene ether resin. The aforementioned thermosetting resins can either be used alone or in combinations of two or more. As used herein, reactive functional groups refer to functional groups cable of conducting a curing reaction with other groups. Examples of reactive functional groups include, but are not limited to, hydroxyl, carboxyl, alkenyl, and amine groups. In some embodiments of the present invention, an epoxy resin, a thermosetting polyphenylene ether resin or a combination thereof are used as the thermosetting resin.

As used herein, an epoxy resin refers to a thermal-curable resin with at least two epoxy functional groups in each molecule, such as a multi-functional epoxy resin and a linear phenolic epoxy resin. Examples of the multi-functional epoxy resin include, but are not limited to, a bifunctional epoxy resin, a tetrafunctional epoxy resin, and an octafunctional epoxy resin. The selection of epoxy resin types suitable for forming the dielectric material is not particularly limited, and one of ordinary skill in the art can choose epoxy resin types as needed after reviewing this disclosure. For example, consideration regarding the flame retardancy of the resin composition might lead to the use of a phosphorus-containing epoxy resin or bromine-containing epoxy resin. When aiming for halogen-free environmental compliance, halogen-free epoxy resin becomes a viable option.

Examples of the aforementioned epoxy resin include, but are not limited to, a dicyclopentadiene (DCPD-type) epoxy resin, a bisphenol epoxy resin, a phenolic epoxy resin, a diphenylethylene epoxy resin, a triazine skeleton-containing epoxy resin, a fluorene skeleton-containing epoxy resin, a triphenol methane epoxy resin, a biphenyl epoxy resin, a xylylene epoxy resin, a biphenyl aralkyl epoxy resin, a naphthalene epoxy resin, and an alicyclic epoxy resin. Examples of the bisphenol epoxy resin include, but are not limited to, a bisphenol A epoxy resin, a bisphenol F epoxy resin or a bisphenol S epoxy resin. Examples of the phenolic epoxy resin include, but are not limited to, a phenol phenolic epoxy resin, a cresol phenolic epoxy resin, a bisphenol A phenolic epoxy resin or a bisphenol F phenolic epoxy resin. Examples of the phosphorus-containing epoxy resin include, but are not limited to, a DOPO-modified epoxy resin, wherein DOPO is 9,10-dihydro-9-oxa-10-phosphahenanthrene-10-oxide. Examples of the bromine-containing epoxy resin include, but are limited to, a tetrabromobisphenol A epoxy resin. The aforementioned epoxy resins can either be used alone or in a mixture of two or more. In the appended examples, a phenolic epoxy resin is used.

The amount of epoxy resin can be adjusted depending on the need. Generally, based on the total weight of the resin composition, the amount of epoxy resin can be 10 wt % to 50 wt %. For example, based on the total weight of the resin composition, the amount of epoxy resin can be 10 wt %, 15 wt %, 20 wt %, 25 wt %, 30 wt %, 35 wt %, 40 wt %, 45 wt %, or 50 wt %, or within a range between any two of the values described herein.

As used herein, a thermosetting polyphenylene ether resin refers to a resin with at least a repeating unit

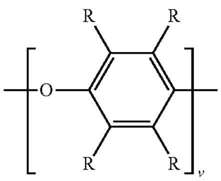

in the main chain and an unsaturated group at the terminal, wherein each R is independently H or a C1-C5 alkyl, and v is an integer ranging from 1 to 100. The unsaturated group refers to a group capable of undergoing addition polymerization with other components containing unsaturated groups. The addition polymerization reaction can be initiated by light or heat in the presence of a polymerization initiator. Examples of the unsaturated group include but are not limited to vinyl, vinyl benzyl, allyl, acrylate, and methacrylate. Examples of the thermosetting polyphenylene ether resin include but are not limited to a vinyl-containing thermosetting polyphenylene ether resin, an allyl-containing thermosetting polyphenylene ether resin, a vinyl benzyl-containing thermosetting polyphenylene ether resin, an acrylate-containing thermosetting polyphenylene ether resin, and a methacrylate-containing thermosetting polyphenylene ether resin. The aforementioned polyphenylene ether resins can be used alone or in a mixture of two or more.

The method for preparing the thermosetting polyphenylene ether resin is not a technical feature of the present invention. Persons having ordinary skill in the art can conduct this method based on the present disclosure and their ordinary skill. Consequently, the method for preparing the thermosetting polyphenylene ether resin is not detailed here. The associated methods for preparing the polyphenylene ether resin can be found in various references, such as U.S. Pat. No. 6,995,195 B2 for vinyl benzyl-containing polyphenylene ether resins, U.S. Pat. No. 5,218,030 A for allyl-containing polyphenylene ether resins, U.S. Pat. No. 5,352,745 A for methacrylate-containing polyphenylene ether resins, U.S. Pat. No. 6,352,782 B2 and US 2016/0280913 A1. These references are incorporated herein in their entireties by reference.

In some embodiments of the present invention, the resin composition comprises a polyphenylene ether resin represented by the following formula (I):

formula (I)

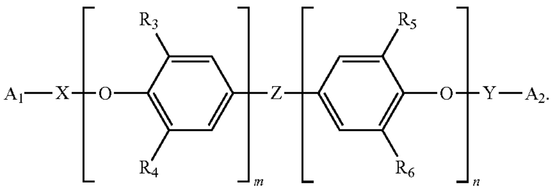

In formula (I), $R_3$, $R_4$, $R_5$ and $R_6$ are independently H, or a substituted or unsubstituted C1-C5 alkyl; m and n are independently an integer ranging from 0 to 100, with the proviso that m and n are not 0 at the same time; Z is absent, —O—,

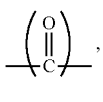, 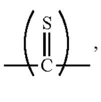, 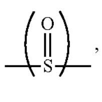, 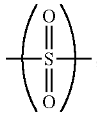,

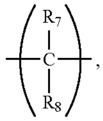, or aryl, wherein $R_7$ and $R_8$ are independently H or a C1-C12 alkyl; X and Y are independently absent, or carbonyl or an alkenyl-containing group; and $A_1$ and $A_2$ are independently

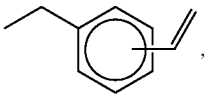, 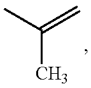,

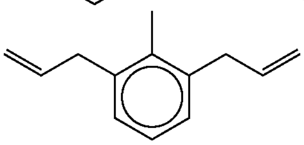,

-continued

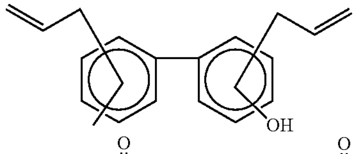,

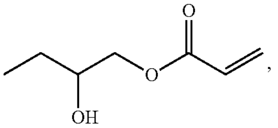, or 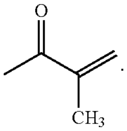.

In a preferred embodiment of the present invention, in formula (I), $R_3$, $R_4$, $R_5$ and $R_6$ are —$CH_3$, Z is

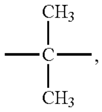,

X and Y are absent, and $A_1$ and $A_2$ are independently

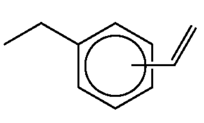 or 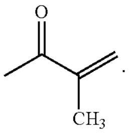.

In general, the weight average molecular weight (Mw) of the thermosetting polyphenylene ether resin can range from 1,000 to 50,000, preferably from 1,000 to 10,000, and more preferably from 1,000 to 5,000. Examples of commercially available thermosetting polyphenylene ether resin include products with a trade name of OPE-2st 1200 and OPE-2st 2200 available from MITSUBISHI GAS CHEMICAL Company, products with a trade name of SA-9000 available from SABIC Company, products with a trade name of PP807 available from Chin Yee Chemical Industry Company, and a polyphenylene ether resin available from ASAHI KASEI Company. For high-frequency applications, utilizing the thermosetting polyphenylene ether resin to form the dielectric material is preferred.

The amount of the thermosetting polyphenylene ether resin can be adjusted depending on the need and is not particularly limited. Generally, based on the total weight of the resin composition, the amount of the thermosetting polyphenylene ether resin can be 15 wt % to 60 wt %. For example, based on the total weight of the resin composition, the amount of the thermosetting polyphenylene ether resin can be 15 wt %, 20 wt %, 25 wt %, 30 wt %, 35 wt %, 40 wt %, 45 wt %, 50 wt %, 55 wt %, or 60 wt %, or within a range between any two of the values described herein.

1.1.1.2. Thermoplastic Resin

The thermoplastic resin exhibits softening upon heating and hardening upon cooling. Examples of the thermoplastic resin include, but are not limited to, a perfluorinated resin and a liquid crystal polymer. The aforementioned thermoplastic resins can be used alone or in a mixture of two or more.

As used herein, the perfluorinated resin refers to a fluorocarbon-based polymer containing over 60% of the number of fluorine atoms. Examples of the perfluorinated resin include but are not limited to polytetrafluoroethylene (PTFE, number of fluorine atoms: 66.7%), polyfluoroalkoxy alkane (PFA, number of fluorine atoms: 66.7%), and fluorinated ethylene propylene copolymer (FEP, number of fluorine atoms: 66.7%). In the appended examples, PTFE is used as the thermoplastic resin.

Examples of commercially available perfluorinated resin include, but are not limited to, products with a trade name of D210 available from Daikin (solid content: 60%), products with a trade name of TEFLON™ PTFE DISP 30LX available from Dupont (solid content: 60%), products with a trade name of ALGOFLON D 3511F available from Solvay (solid content: 59%), products with a trade name of INOFLON® AD9300 available from Gujarat Fluorochemicals Limited (solid content: 60%), and products with a trade name of DYNEON™ TF5050Z available from 3M (solid content: 58%). For high-frequency applications, utilizing the perfluorinated resin to form the dielectric material is preferred.

The amount of the perfluorinated resin can be adjusted depending on the need and is not particularly limited. Generally, based on the total weight of the resin composition, the amount of the perfluorinated resin can be 30 wt % to 90 wt %. For example, based on the total weight of the resin composition, the amount of the perfluorinated resin can be 30 wt %, 35 wt %, 40 wt %, 45 wt %, 50 wt %, 55 wt %, 60 wt %, 65 wt %, 70 wt %, 75 wt %, 80 wt %, 85 wt %, or 90 wt %, or within a range between any two of the values described herein.

1.1.1.3. Additives

Applicable additives include, but are not limited to, a catalyst, an elastomer, a filler, a dispersing agent, a toughener, a viscosity modifying agent, a flame retardant, a plasticizer, and a coupling agent. The aforementioned additives can be used alone or in a mixture of two or more.

1.1.1.3.1. Hardener

When the resin composition comprises thermosetting resin, a hardener can be further added to increase the degree of crosslinking. The hardener refers to a component with unsaturated functional groups that can undergo crosslinking reaction with other components containing unsaturated functional groups (e.g., epoxy resin or thermosetting polyphenylene ether resin) to form a stereo network structure. The types of the hardener are not particularly limited as long as it can increase the degree of crosslinking.

In some embodiments of the present invention, when the resin composition comprises epoxy resin, examples of suitable hardeners include, but are not limited to, a —OH group-containing compound, an amine-containing compound, an anhydride compound, and an active ester compound. The aforementioned hardeners can be used alone or in a mixture of two or more. Specific examples of the hardener include but are not limited to phenolic resin (PN resin), styrene maleic anhydride copolymer (SMA copolymer), bismaleimide (BMI), dicyandiamide (Dicy), 4,4'-diaminodiphenyl sulfone (DDS), dianilinomethane, an aromatic diamine, an aromatic dianhydride, an aliphatic dianhydride, a triazine, a cyanate ester resin (CE), a phenolic triazine resin, a benzoxazine resin and a ring-opening polymer thereof, and a copolymer of styrene and vinylphenol. In the appended examples, the hardener is Dicy or BMI.

In some embodiments of the present invention, when the resin comprises the thermosetting polyphenylene ether resin, the hardener can be selected from the group consisting of BMI, a butadiene and/or styrene-containing elastomer, a vinyl and/or allyl-containing isocyanurate, and combinations thereof. In the appended examples, allyl-containing isocyanurate is used.

The amount of the hardener can be adjusted depending on the need. In general, based on the total weight of the resin composition, the amount of the hardener can be 15 wt % to 65 wt %. For example, based on the total weight of the resin composition, the amount of the hardener can be 15 wt %, 20 wt %, 25 wt %, 30 wt %, 35 wt %, 40 wt %, 45 wt %, 50 wt %, 55 wt %, 60 wt %, or 65 wt %, or within a range between any two of the values described herein.

1.1.1.3.2. Catalyst

When the resin composition comprises thermosetting resin, a catalyst can be further added to promote the curing reaction. The catalyst refers to a component that promotes the curing reaction: for example, it can facilitate the ring-opening reaction of epoxy functional groups and lower the curing reaction temperature of the resin composition.

The types of the catalyst are not particularly limited as long as it can promote a curing reaction. Suitable catalysts include, but are not limited to, organic peroxides, tertiary amines, quaternary ammonium salts, imidazole compounds, and pyridine compounds. Examples of organic peroxides include but are not limited to benzoyl peroxide (BPO), dicumyl peroxide (DCP) and α,α'-bis(t-butylperoxy)diisopropyl benzene. Examples of tertiary amines include but are not limited to dimethylbenzylamine, 2-(dimethylaminomethyl) phenol, and 2,4,6-tris(dimethylaminomethyl) phenol. Examples of imidazole compounds include but are not limited to 2-methylimidazole, 2-ethyl-4-methyl imidazole, and 2-phenylimidazole. Examples of pyridine compounds include but are not limited to 2,3-diaminopyridine, 2,5-diaminopyridine, 2,6-diaminopyridine, 4-dimethylaminopyridine, 2-amino-3-methylpyridine, 2-amino-4-methylpyridine, and 2-amino-3-nitropyridine. The aforementioned catalysts can be used alone or in a mixture of two or more.

When the resin composition comprises epoxy resin, the catalyst is preferably selected from tertiary amines, quaternary ammonium salts, imidazole compounds, and pyridine compounds. In the appended examples, 2-methylimidazole is used as the catalyst for the epoxy resin. When the resin composition comprises the thermosetting polyphenylene ether resin, the catalyst is preferably selected from organic peroxides. In the appended examples, α,α'-bis(t-butylperoxy)diisopropyl benzene is used as the catalyst for the thermosetting polyphenylene ether resin.

The amount of the catalyst can be adjusted depending on the need and is not particularly limited. Generally, based on the total weight of the resin composition, the amount of the catalyst can be 10 ppm to 2 wt %. For example, based on the total weight of the resin composition, the amount of the catalyst can be 10 ppm. 50 ppm. 100 ppm. 500 ppm. 0.1 wt %, 0.5 wt %, 1 wt %, 1.5 wt %, or 2 wt %, or within a range between any two of the values described herein.

1.1.1.3.3. Flame Retardant

The resin composition can further comprise a flame retardant to improve the thermal resistance and flame retardance of prepared electronic materials. The types of the flame retardant include but are not limited to a phosphorus-containing flame retardant, a bromine-containing flame retardant and a nitrogen-containing compound, and each type of flame retardants can be used alone or in any combination.

Examples of the phosphorus-containing flame retardant include but are not limited to phosphate esters, phosphazenes, ammonium polyphosphate, metal phosphinates, and melamine phosphate. The aforementioned phosphorus-containing flame retardants can be used alone or in a mixture of two or more.

Examples of the bromine-containing flame retardant include but are not limited to tetrabromobisphenol A, decabromodiphenyloxide, decabrominated diphenyl ethane, 1,2-bis(tribromophenyl) ethane, brominated epoxy oligomer, octabromotrimethylphenyl indane, bis(2,3-dibromopropyl ether), tris(tribromophenyl) triazine, brominated aliphatic hydrocarbon, and brominated aromatic hydrocarbon. The aforementioned bromine-containing flame retardants can be used alone or in a mixture of two or more. Examples of the nitrogen-containing compound include but are not limited to melamine and derivatives thereof. The commercially-available phosphorus-containing flame retardants include products with a trade name of Melapur 200 available from BASF Company.

The amount of the flame retardant can be adjusted depending on the need and is not particularly limited. Generally, based on the total weight of the resin composition, the amount of the flame retardant can be 0 wt % to 30 wt %. For example, based on the total weight of the resin composition, the amount of the flame retardant can be 0 wt %, 1 wt %, 5 wt %, 10 wt %, 15 wt %, 20 wt %, 25 wt %, or 30 wt %, or within a range between any two of the values described herein.

1.1.1.3.4. Filler

The resin composition can optionally further comprise a filler to improve the mechanical strength, thermal conductivity and dimensional stability of the prepared electronic materials. Examples of suitable fillers include, but are not limited to, those selected from the group consisting of silicon dioxide (including hollow silicon dioxide), alumina, magnesium oxide, magnesium hydroxide, calcium carbonate, talc, clay, aluminum nitride, boron nitride, aluminum hydroxide, silicon aluminum carbide, silicon carbide, sodium carbonate, titanium dioxide, zinc oxide, zirconium oxide, quartz, diamond powder, diamond-like powder, graphite, calcined kaolin, pryan, mica, hydrotalcite, PTFE powder, glass bead, ceramic whisker, carbon nanotube, and nanosized inorganic powder. In the appended examples, the filler is silica.

The amount of the filler can be adjusted depending on the need and is not particularly limited. Generally, based on the total weight of the resin composition, the amount of the filler can be 0 wt % to 60 wt %. For example, based on the total weight of the resin composition, the amount of the filler can be 0 wt %, 1 wt %, 5 wt %, 10 wt %, 15 wt %, 20 wt %, 25 wt %, 30 wt %, 35 wt %, 40 wt %, 45 wt %, 50 wt %, 55 wt %, or 60 wt %, or within a range between any two of the values described herein.

1.1.2. Preparation of Resin Composition

Regarding the preparation of the thermosetting resin composition, the thermosetting resin composition may be prepared into a slurry or a colloidal group varnish-like form for subsequent processing by uniformly mixing the components of the thermosetting resin composition, including thermosetting resin and optionally additives, with a stirrer, and dissolving or dispersing the resultant mixture in a solvent. The solvent can be any inert solvent that can dissolve or disperse the components of the thermosetting resin composition but does not react with the components of the thermosetting resin composition. For example, solvents that can dissolve or disperse the components of the thermosetting resin composition include but are not limited to toluene, γ-butyrolactone, methyl ethyl ketone, cyclohexanone, butanone, acetone, xylene, methyl isobutyl ketone, N,N-dimethylformamide (DMF), N,N-dimethylacetamide (DMAc), and N-methylpyrolidone (NMP). The aforementioned solvents can be used alone or in a mixture of two or more. The amount of the solvent in the thermosetting resin composition is not particularly limited as long as the components of the thermosetting resin composition can be evenly dissolved or dispersed therein. In the appended examples, the solvent is methyl ethyl ketone.

Regarding the preparation of the thermoplastic resin composition, if the thermoplastic resin is a solid, the aforementioned preparation of the thermosetting resin composition still can be used except that the solvent is selected from the group consisting of water, ethanol, isopropanol, acetone, and combinations thereof. If the thermoplastic resin is in suspension, provided there is sufficient solvent content in the suspension, the suspension of the thermoplastic resin and optional additives can be directly stirred to produce a slurry or colloid without requiring additional solvent.

1.2. Adhesive Layer

The inventor discovered that during the hot-pressing of a laminate using a perfluorinated resin as the adhesive layer between copper foil and dielectric layer, the phosphorus elements from the copper foil's surface that is in contact with the adhesive layer react with the functional groups of the perfluorinated resin in the adhesive layer. This reaction leads to chemical bond cleavage within the molecular chains of the perfluorinated resin, thereby decreasing the adhesion (peeling strength) between the adhesive layer and the copper foil. Consequently, in the adhesive layer of the copper clad laminate of the present invention, the adhesive layer is formed from an adhesive material containing non-perfluorinated resin, preferably excluding perfluorinated resin.

The non-perfluorinated resin refers to a fluorocarbon-based polymer containing no more than 60% of the number of fluorine atoms. Examples of the non-perfluorinated resin include, but are not limited to, polychlorotrifluoroethylene (PCTFE, number of fluorine atoms: 50%), polyvinylidene difluoride (PVDF, number of fluorine atoms: 33.3%), polyvinyl fluoride (PVF, number of fluorine atoms: 16.7%), ethylene-tetrafluoroethylene copolymer (ETFE copolymer, number of fluorine atoms: 33.3%), and ethylene-chloro trifluoroethylene copolymer (ECTFE copolymer, number of fluorine atoms: 25%).

The non-perfluorinated resin includes modified non-perfluorinated resin manufactured by subjecting a perfluorinated resin to a plasma treatment or chemical treatment. Commercially available modified non-perfluorinated resins include, but are not limited to, products with a trade name of GK-570 (number of fluorine atoms: 24.4%) and a trade name of SE-405 (number of fluorine atoms: 24.4%) available from Daikin. The amount of the non-perfluorinated resin can be adjusted depending on the need. In general, based on the total weight of the adhesive material, the amount of the non-perfluorinated resin can be 80 wt % to 95 wt %. For example, based on the total weight of the adhesive material, the amount of the non-perfluorinated resin can be 80 wt %, 81 wt %, 82 wt %, 83 wt %, 84 wt %, 85 wt %, 86 wt %, 87 wt %, 88 wt %, 89 wt %, 90 wt %, 91 wt %, 92 wt %, 93 wt %, 94 wt %, or 95 wt %, or within a range between any two of the values described herein.

The adhesive material can optionally comprise a surfactant to adaptively improve the interfacial properties of the adhesive material. Examples of the surfactant include but are not limited to a fluorine-based surfactant. Examples of the fluorine-based surfactant include, but are not limited to, perfluorobutanoic acid (PFBA), perfluoropentanoic acid (PFPA), perfluorohexanoic acid (PFHxA), perfluoroheptanoic acid (PFHpA), perfluorooctanoic acid (PFOA), perfluorononanoic acid (PFNA), perfluorodecanoic acid (PFDA), perfluorobutane sulfonamide (H-FBSA), perfluorooctanesulfonamide (PFOSA), perfluorohexanesulfonic acid (PFHxS), and perfluorooctanesulfonic acid (PFOS). The amount of the surfactant can be adjusted depending on the need and is not particularly limited. Generally, based on the total weight of the adhesive material, the amount of the surfactant can be 5 wt % to 20 wt %. For example, based on the total weight of the adhesive material, the amount of the surfactant can be 5 wt %, 6 wt %, 7 wt %, 8 wt %, 9 wt %, 10 wt %, 11 wt %, 12 wt %, 13 wt %, 14 wt %, 15 wt %, 16 wt %, 17 wt %, 18 wt %, 19 wt %, or 20 wt %, or within a range between any two of the values described herein.

Regarding the preparation of the adhesive material, the adhesive material may be obtained by uniformly mixing the non-perfluorinated resin and optional surfactants with a stirrer, dissolving or dispersing the resultant mixture in a solvent, and optionally stirring for 10 minutes to 30 minutes at a rotational speed of 500 rpm to 1000 rpm. The amount of the solvent is not particularly limited as long as the solvent can dissolve or disperse the components of the adhesive material. Examples of the solvent that can dissolve or disperse the components of the adhesive material include but are not limited to water, toluene, ethanol, isopropanol, and acetone. In the appended examples, the solvent is water or toluene.

The adhesive layer may be formed by using the adhesive material through a conventional forming method in the art. In some embodiments of the present invention, the adhesive material is coated onto a copper foil and dried in a manner that the dried adhesive layer has a specific thickness to obtain a copper foil with adhesive layer. The coating method is not particularly limited. For example, the coating method can be gravure coating, die coating or knife coating. Coating may also be performed by using a scraper or bar coater. In some embodiments of the present invention, the copper foil with adhesive layer is obtained by coating the adhesive material onto the surface of the copper foil, and then sintering the copper foil coated with the adhesive material at a temperature of 300° C. to 400° C. for 15 minutes to 60 minutes.

The thickness of the adhesive layer is not particularly limited. The thickness of the adhesive layer preferably ranges between 5 μm to 15 μm. For example, the thickness of the adhesive layer can be 5 μm, 6 μm, 7 μm, 8μ, 9 μm, 10 μm, 11 μm, 12 μm, 13 μm, 14μ, 15 μm, or within a range between any two of the values described herein.

1.3. Copper Foil

The copper foil used in the present invention has a first surface which has a ten-point average roughness (Rz) of less than 0.5 μm. The copper foil also has a phosphorus content of no more than 499 μg/dm$^2$ at the first surface. In some embodiments of the present invention, the copper foil is a copper foil that is not subjected to a surface roughening treatment.

1.3.1. Type and Material of Copper Foil

Previously, copper foils used for rigid substrates were electrodeposited copper foils, while copper foils used on flexible substrates were rolled annealed copper foil. However, with advancements of flexible substrates, electro-deposited copper foils with characteristics similar to rolled annealed copper foils have been developed. Thus, there are no specific limitations on the types of copper foils used in the copper clad laminate of the present invention, allowing for any kind of copper foil, including electro-deposited copper foils and rolled annealed copper foils.

The electro-deposited copper foil is usually manufactured by electrolytically depositing copper from a copper sulfate plating bath onto a titanium or stainless drum. The rolled annealed copper foil, on the other hand, is usually manufactured by subjecting copper ingots to repeated plastic working and heat treatments using a calender roll. The material of the copper foil include, but is not limited to, refined copper (JIS H3100 alloy number C1100), oxygen-free copper (JIS H3100 alloy number C1020 or JIS H3510 alloy number C1011), phosphorus deoxidized copper (JIS H3100 alloy number C1201, C1220 or C1221), electrolytic copper, Sn-doped copper, Ag-doped copper, Cr-added copper alloy, Zr-added copper alloy, Mg-added copper alloy, and corson-based copper alloy added with Ni, Si and the like. In addition, the copper foil can optionally comprise 30 ppm to 300 ppm of one or more elements selected from the group consisting of P, B, Ti, Mn, V, Cr, Mo, Ag, Sn, In, Au, Pd, Zn, Ni, Si, Zr, and Mg.

Furthermore, to improve rust resistance, dielectric properties, thermal resistance and chemical resistance of the copper foil and to enhance the adhesion between the copper foil and the dielectric material, the copper foil can be subjected to suitable surface treatments. The surface treatments include, but are not limited to, a roughening treatment, a thermal-resistance enhancement, a rust-prevention treatment, a chromate treatment, and a silane-coupling treatment. In some embodiments of the present invention, the copper foil can be subjected to one or more of the aforementioned surface treatments, with the proviso that the first surface of the surface-treated copper foil has a ten-point average roughness (Rz) of less than 0.5 μm and a phosphorus content of no more than 499 μg/dm$^2$.

1.3.2. Properties of Copper Foil

The first surface of the copper foil of the present invention has a ten-point average roughness (Rz) of less than 0.5 μm. The Rz is measured by using a contact-type surface roughness measurement instrument in accordance with JIS B0601: 2001, and the diameter of the probe is 2 μm. The Rz of the first surface of the copper foil of the present invention can be 0.49 μm, 0.48 μm, 0.47 μm, 0.46 μm, 0.48 μm, 0.44 μm, 0.43 μm, 0.42 μm, 0.41 μm, 0.40 μm, 0.39 μm, 0.38 μm, 0.37 μm, 0.36 μm, 0.35 μm, 0.34 μm, 0.33 μm, 0.32 μm, 0.31 μm, 0.30 μm, 0.29 μm, 0.28 μm, 0.27 μm, 0.26 μm, 0.25 μm, 0.24 μm, 0.23 μm, 0.22 μm, 0.21 μm, 0.20 μm, 0.19 μm, 0.18 μm, 0.17 μm, 0.16 μm, 0.15 μm, 0.14 μm, 0.13 μm, 0.12 μm, 0.11 μm, 0.10 μm, 0.09 μm, 0.08 μm, 0.07 μm, 0.06 μm, 0.05 μm, 0.04 μm, 0.03 μm, 0.02 μm, 0.01 μm, or 0 μm, or within a range between any two of the values described herein.

In addition, the phosphorus content of the copper foil at the first surface is no more than 499 μg/dm$^2$. For example, the phosphorus content of the copper foil at the first surface can be 499 μg/dm$^2$, 490 μg/dm$^2$, 480 μg/dm$^2$, 470 μg/dm$^2$, 460 μg/dm$^2$, 450 μg/dm$^2$, 440 μg/dm$^2$ 430 μg/dm$^2$, 420 μg/dm$^2$, 410 μg/dm$^2$, 400 μg/dm$^2$, 390 μg/dm$^2$, 380 μg/dm$^2$, 370 μg/dm$^2$, 360 μg/dm$^2$, 350 μg/dm$^2$, 340 μg/dm$^2$, 330 μg/dm$^2$, 320 μg/dm$^2$, 310 μg/dm$^2$, 300 μg/dm$^2$, 290 μg/dm$^2$, 280 μg/dm$^2$, 270 μg/dm$^2$, 260 μg/dm$^2$, 250 μg/dm$^2$, 240 μg/dm$^2$, 230 μg/dm$^2$, 220 μg/dm$^2$, 210 μg/dm$^2$, 200 μg/dm$^2$, 190 μg/dm$^2$, 180 μg/dm$^2$, 170 μg/dm$^2$, 160 μg/dm$^2$, 150 μg/dm$^2$, 140 μg/dm$^2$, 130 μg/dm$^2$, 120 μg/dm$^2$, 110 μg/dm$^2$, 100 μg/dm$^2$, 90 μg/dm$^2$, 80 μg/dm$^2$, 70 μg/dm$^2$, 60 μg/dm$^2$, 50 μg/dm$^2$, 40 μg/dm$^2$, 30 μg/dm$^2$, 20 μg/dm$^2$, 10 μg/dm$^2$, or 0 μg/dm$^2$, or within a range between any two of the values described herein. In some embodiments of the present invention, the copper foil has a phosphorus content of no more than 199 μg/$dm^2$ at the first surface.

The test method for determining the phosphorus content is described as follows. Initially, a 10 cm×10 cm test sample is cut from the copper foil, with the surface not being tested (i.e., the second surface other than the first surface) covered with a transparent tape. Subsequently, the test sample is laid flat within a glass container, positioning the first surface facing upwards. 100 ml of nitric acid solution (composition: nitric acid and water) with a weight percent concentration of 21% is poured into the glass container, ensuring the liquid level surpasses the test sample. The test sample is immersed at room temperature for 30 seconds before being removed. The phosphorus content in the nitric acid solution is measured using ICP (inductively coupled plasma) emission spectrometry. Three test samples are tested in accordance with the aforementioned procedure, and an average value of the phosphorus content at the surface of the copper foil is determined.

The thickness of the copper foil is not particularly limited, preferably ranging from 8 μm to 25 μm. For example, the thickness of the copper foil can be 8 μm, 9 μm, 10 μm, 11 μm, 12 μm, 13 μm, 14 μm, 15 μm, 16 μm, 17 μm, 18 μm, 19 μm, 20 μm, 21 μm, 22 μm, 23 μm, 24 μm, or 25 μm, or within a range between any two of the values described herein. The thickness of the copper foil is a weight average thickness that is obtained by dividing the unit area weight of the copper foil (unit: g/$m^2$) by the density of the copper foil (unit: g/$m^3$).

1.3.3. Preparation of Copper Foil

The copper foil can be manufactured by the following method, but the present invention is not limited thereto. First, a copper electrolyte solution containing copper ions ($Cu^{2+}$) ranging from 65 g/L to 100 g/L, sulfuric acid ($H_2SO_4$) from 85 g/L to 105 g/L and chloride ions ($Cl^-$) from 1.0 ppm to 30 ppm is prepared. The copper electrolyte solution is introduced into a raw foil electrolysis equipment with a rotating cathode roll and an insoluble anode, and a current having a current density of 30 A/$dm^2$ to 60 A/$dm^2$ is applied to the cathode roll and the insoluble anode, respectively. Afterwards, the copper electrolyte solution is maintained at a temperature of 50° C. to 58° C., and a very low profile (VLP) raw foil is obtained and continuously wound onto a guiding roll. The VLP raw foil is conveyed at a production speed of 10 m/min by several guiding rolls into a continuous surface treatment device. The continuous surface treatment device includes roughening treatment tank 1, roughening treatment tank 1A, curing treatment tank 2, curing treatment tank 3, roughening treatment tank 4, roughening treatment tank 5, curing treatment tank 6, curing treatment tank 7, nickel-plating treatment tank 8, zinc-plating treatment tank 9, acid treatment tank 10, pure water treatment tank 10A, and silane treatment tank 11. In some embodiments of the present invention, electricity is not supplied to roughening treatment tank 1, roughening treatment tank 1A, curing treatment tank 2, curing treatment tank 3, roughening treatment tank 4, roughening treatment tank 5, curing treatment tank 6, curing treatment tank 7, and nickel-plating treatment tank 8, while electricity is only supplied to zinc-plating treatment tank 9, acid treatment tank 10, pure water treatment tank 10A, and silane treatment tank 11. In other words, when the VLP raw foil passes the unelectrified roughening treatment tank 1, roughening treatment tank 1A, curing treatment tank 2, curing treatment tank 3, roughening treatment tank 4, roughening treatment tank 5, curing treatment tank 6, curing treatment tank 7, and nickel-plating treatment tank 8, it only immerses the solutions (e.g., electroplating solutions) in each treatment tank without undergoing relevant treatments. Conversely, as the VLP raw foil passes the electrified zinc-plating treatment tank 9, acid treatment tank 10, pure water treatment tank 10A, and silane treatment tank 11, it undergoes relevant treatments. Thus, the VLP raw foil undergoes one zinc-plating treatment, one acid treatment, one pure water treatment, and one silane treatment. The resulting non-roughened electro-deposited copper foil has a thickness of 18 μm and an Rz of less than 0.5 μm at the first surface, applicable in the present invention. The parameters for continuous surface treatment tanks are listed in Tables 1-1 and 1-2. The treatment solution used in treatment tank 11 is a solution comprising (3-epoxypropoxypropyl) trimethoxysilane as a silane coupling agent, wherein the concentration of the silane coupling agent ranges from 5 g/L to 7 g/L, and the solvent used to form the treatment solution is water.

TABLE 1-1

Parameters for continuous surface treatment tanks

| Number of treatment tank | Type of surface treatment | Metal ion | Concentration of metal ion (g/L) | Content of fluorine (ppm) | Type of acid/base | Concentration of acid/base (g/L) |
|---|---|---|---|---|---|---|
| 1 | Roughening | $Cu^{2+}$ | 5.0 to 10 | 0 to 3 | Sulfuric acid | 90 to 100 |
| 1A | Roughening | $Cu^{2+}$ | 5.0 to 10 | 0 to 3 | Sulfuric acid | 90 to 100 |
| 2 | Curing | $Cu^{2+}$ | 66 to 80 | 0 to 3 | Sulfuric acid | 60 to 75 |
| 3 | Curing | $Cu^{2+}$ | 66 to 80 | 0 to 3 | Sulfuric acid | 60 to 75 |
| 4 | Roughening | $Cu^{2+}$ | 5.0 to 10 | 0 to 3 | Sulfuric acid | 90 to 100 |
| 5 | Roughening | $Cu^{2+}$ | 5.0 to 10 | 0 to 3 | Sulfuric acid | 90 to 100 |
| 6 | Curing | $Cu^{2+}$ | 66 to 80 | 0 to 3 | Sulfuric acid | 60 to 75 |
| 7 | Curing | $Cu^{2+}$ | 66 to 80 | 0 to 3 | Sulfuric acid | 60 to 75 |
| 8 | Ni plating*[1] | $Ni^{2+}$ | 17 to 20 | 0 to 3 | Phosphoric acid | 3 to 6 |
| 9 | Zn plating | $Zn^{2+}$ | 2 to 4 | 0 to 3 | Boric acid | 10 to 25 |
| 10 | Chromic acid and phosphoric acid | $Cr^{6+}$ | 1 to 3 | 0 to 3 | Phosphoric acid | 0.1 to 2.0 |
| 10A | Pure water | None | None | 0 to 3 | None | None |
| 11 | Silane | None | None | 0 to 3 | None | None |

*[1]In some embodiments of the present invention, the solution in treatment tank 8 is pure water rather than an electroplating solution.

TABLE 1-2

| Parameters for continuous surface treatment tanks | | | | |
|---|---|---|---|---|
| Number of treatment tank | Type of surface treatment | Trace component*2 (ppm) | Temperature of treatment tank*3 (° C.) | pH of treatment tank |
| 1 | Plating | 180 to 220 | 30 | <1.5 |
| 1A | Plating | 180 to 220 | 30 | <1.5 |
| 2 | Plating | 30 to 40 | 45 | <1.5 |
| 3 | Plating | 30 to 40 | 45 | <1.5 |
| 4 | Plating | 180 to 220 | 30 | <1.5 |
| 5 | Plating | 180 to 220 | 30 | <1.5 |
| 6 | Plating | 30 to 40 | 45 | <1.5 |
| 7 | Plating | 30 to 40 | 45 | <1.5 |
| 8 | Plating | 100 to 200 | 28 | 3 to 4 |
| 9 | Plating | 100 to 200 | 30 | 4 to 5 |
| 10 | Plating | 100 to 200 | 40 | 3 to 4 |
| 10A | Rinsing | None | 40 | 6.5 to 7 |
| 11 | Immersing | 0 to 20 | 40 | Not applicable |

*2 Examples of trace component include, but are not limited to, Ni, Pd, Ag and W.
*3 The tolerance of the temperature of treatment tank is ±5° C.

In addition, in treatment tanks 9, 10 and 10A, trace components may be present in the electroplating solution as $SO_4^{2-}$, $HSO_4^-$, $PO_4^{3-}$, $HPO_4^{2-}$, $H_2PO_4^-$ and the like. One technical feature of the present inventions is to adjust the phosphorus content at the first surface of the copper foil by controlling the phosphorus content in treatment tanks 8 and 10, as well as the water content in treatments 10A. Specifically, the phosphorus content at the first surface of the copper foil can be adjusted by regulating the phosphorus content in the electroplating solution (unit: g/L), the rate of water flow (unit: L/s (Liter/second)), and the rinsing time (unit: seconds).

1.4. Preparation of Copper Clad Laminate

The copper clad laminate of the present invention can be prepared as follows. First, a resin sheet is provided as a dielectric layer, wherein the method of forming the resin sheet is as described above. Then, an adhesive material comprising a non-perfluorinated resin is provided and applied onto at least one side of the dielectric layer to form an adhesive layer, wherein the composition of the adhesive material is as described above. Afterwards, a copper foil with the aforementioned properties is provided and disposed at the other side of the adhesive layer opposite to the dielectric layer to obtain a superimposed object. Subsequently, the superimposed object is subjected to a hot-pressing operation to obtain a copper clad laminate. The conditions for the hot-pressing operation are illustrated below. When the dielectric layer comprises a thermoplastic resin, the hot-pressing is performed at a temperature of 300° C. to 450° C. and a full pressure of 20 $kg/cm^2$ to 40 $kg/cm^2$ (with an initial pressure of 1 (one) $kg/cm^2$ to 8 $kg/cm^2$) for a duration of 5 hours to 12 hours. When the dielectric layer comprises a thermosetting resin, the hot-pressing is performed at a temperature of 160° C. to 300° C. and a full pressure of 10 $kg/cm^2$ to 25 $kg/cm^2$ (with an initial pressure of 5 $kg/cm^2$ to 12 $kg/cm^2$) for a duration of 1 (one) hour to 4 hours.

2. PRINTED CIRCUIT BOARD

The copper clad laminate of the present invention can be utilized to provide a printed circuit board by further patterning its external copper foil. Therefore, the present invention also provides a printed circuit board, which is manufactured by further patterning the external copper foil of the copper clad laminate of the present invention. The method for patterning copper foil is not particularly limited and may include techniques such as photolithography, screen printing, and ink-jet printing, among others.

3. EXAMPLES

3.1. Testing Methods

The present invention is further illustrated by the embodiments hereinafter, wherein the testing instruments and methods are as follows.

[Measurement of Ten-Point Average Roughness (Rz)]

The ten-point average roughness (Rz) of the copper foil is measured in accordance with JIS B0601:2001. The unit of Rz is μm.

[Measurement of Phosphorus Content at Surface]

Initially, the copper foil is cut into a 10 cm×10 cm test sample, and the surface no under test (i.e., the second surface apart from the first surface) is covered with a transparent tape. Subsequently, the test sample is place flat inside a glass container with the first surface facing upwards. 100 ml of nitric acid solution (composition: nitric acid and water) with a weight percent concentration of 21% is poured into the glass container to ensure the liquid level surpasses the test sample. The test sample remains immersed for 30 seconds at room temperature and is then removed. The phosphorus content in the nitric acid solution is measured using ICP (inductively coupled plasma) emission spectrometry. Three test sample pieces are tested in accordance with the aforementioned method, yielding an average value for the phosphorus content at the copper foil's surface. The unit for phosphorus content is $\mu g/dm^2$.

[Peeling Strength Test]

The peeling strength refers to the adhesion between the copper foil and the dielectric layer. The peeling strength is expressed by the force required for vertically peeling off a ⅛-inch-wide copper foil from the laminate. The unit for the peel strength is lbf/in.

[Thermal Resistance Test]

The peeling strength of the copper clad laminate after reflow soldering represents its thermal resistance. Initially, the copper clad laminate undergoes reflow soldering in an IR reflow oven (model: TSK-8000, available from Der Pan Electric Mechanical Industrial) at 260° C. for 10 seconds. The above procedure constitutes one reflow soldering treatment. After subjecting the copper clad laminate to this reflow soldering treatment ten times, the peeling strength of the treated copper clad laminate is measured using the method described in the previous section [peeling strength test]. The unit for the peel strength is lbf/in.

[Anti-Aging Property Test]

The peeling strength of the copper clad laminate after aging represents its anti-aging property. Initially, the copper clad laminate undergoes a process in which it is placed in a dryer at 105° C. for 2 hours to eliminate any moisture present. Subsequently, the copper clad laminate is removed from the dryer and allowed to naturally cool down to 25° C.

inside a desiccator. The dried copper clad laminate is then subjected to an aging treatment in an oven at 177° C. for 10 days. Afterwards, the peeling strength of the treated copper clad laminate is measured using the method as described in the previous section [peeling strength test]. The unit for the peel strength is lbf/in.

3.2. List of Raw Materials Used in Examples and Comparative Examples

TABLE 2

| List of raw materials | |
|---|---|
| Model no. | Description |
| D-210 | PTFE, a perfluorinated resin (number of fluorine atoms: 66.7%), available from Daikin Industries |
| 335D | PFA, a perfluorinated resin (number of fluorine atoms: 66.7%), available from Chemous |
| SE-405 | A non-perfluorinated resin (number of fluorine atoms: 24.4%), available from Daikin Industries |
| GK-570 | A non-perfluorinated resin (number of fluorine atoms: 24.4%), available from Daikin Industries |
| PFOA | A surfactant, available from Neos |
| TAIC | Triallyl isocyanurate, available from Evonik Industries |
| Dicy | Dicyandiamide, available from Diggesa |
| SA9000 | Polyphenylene ether, available from SABIC |
| BNE-210 | Epoxy resin, available from Chang Chun Plastics |
| Ricon 100 | An elastomer, available from Cray Valley |
| BMI-70 | Bismaleimide resin, available from K•I Chemical Industry |
| 2MI | A catalyst, available from Union Chemical |
| Perbutyl P | A catalyst, available from NOF Corporation |
| SC-5500 SVC | A $SiO_2$ filler, available from Admatech |

3.3. Preparation of Copper Clad Laminate

Preparation Example 1 for Dielectric Layer 666.67 g of PTFE dispersion D-210 (PTFE solid content: 60 wt %) and 600 g of filler SC-5500 SVC were thoroughly mixed to form a varnish. The filler content is 60 wt % based on the total amount of the varnish. Then, the varnish was further stirred to form a dough-like substance, which was then extruded to produce a sheet-shaped material. The sheet-shaped material was then baked at 150° C. to eliminate moisture and surfactants. Finally, the sheet-shaped material was baked at 360° C. for 10 minutes to obtain a PTFE dielectric layer without any reinforcing material (hereinafter "PTFE dielectric layer 1"). The thickness of PTFE dielectric layer 1 is 254 μm.

Preparation Example 2 for Dielectric Layer 1333.33 g of PTFE dispersion D-210 (PTFE solid content: 60 wt %) and 200 g of filler SC-5500 SVC were thoroughly mixed to form a varnish. The filler content is 20 wt % based on the total amount of the varnish. Then, a 1080 type E-glass fiber fabric (thickness: 60 μm) was prepared and impregnated with the varnish for two times to have a sufficient amount of resin being attached to the E-glass fiber fabric. Afterwards, the impregnated E-glass fiber fabric was baked at 360° C. for 10 minutes to obtain a PTFE dielectric layer with a reinforcing material (hereinafter "PTFE dielectric layer 2"). The thickness of PTFE dielectric layer 2 is 254 μm.

Preparation Example 3 for Dielectric Layer 50.0 g of polyphenylene ether SA9000, 50.0 g of TAIC, 10.0 g of elastomer Ricon 100, 1.0 g of catalyst Perbutyl P and 100.0 g of filler SC-5500 SVC were mixed using a stirrer at room temperature. Methyl ethyl ketone (available from Methyl Company) and toluene (available from Trans Chief Chemical Industry Company) were then added to the mixture. Subsequently, the resultant mixture was stirred at room temperature for 60 to 120 minutes to obtain a polyphenylene ether resin composition. Afterwards, a 1080 type E-glass fiber fabric (thickness: 64 μm) was prepared and impregnated with the polyphenylene ether resin composition. The impregnated E-glass fiber fabric was then baked at 175° C. for 2 minutes to obtain a PPE dielectric layer with a reinforcing material (hereinafter "PPE dielectric layer"). The thickness of PPE dielectric layer is 254 μm.

Preparation Example 4 for Dielectric Layer 13.0 g of epoxy resin BNE-210, 25.0 g of Dicy, 15.0 g of BMI-70, 0.01 g of catalyst 2 MI and 30.0 g of $SiO_2$ filler SC-5500 SVC were mixed using a stirrer at room temperature. Methyl ethyl ketone (available from Methyl Company) was then added to the mixture. Subsequently, the resultant mixture was stirred at room temperature for 60 to 120 minutes to obtain an epoxy resin composition. Afterwards, a 1080 type E-glass fiber fabric (thickness: 64 μm) was prepared and impregnated with the epoxy resin composition. The impregnated E-glass fiber fabric was then baked at 175° C. for 2 minutes to obtain an epoxy dielectric layer with a reinforcing material (hereinafter "Epoxy dielectric layer"). The thickness of Epoxy dielectric layer is 254 μm.

Preparation Example for Copper Foil

Initially, a copper electrolyte solution comprising copper ions ($Cu^{2+}$) at concentrations from 65 g/L to 100 g/L, sulfuric acid ($H_2SO_4$) at about 85 g/L to 105 g/L and chloride ions ($Cl^-$) between 1.0 ppm to 30 ppm was prepared. Subsequently, the resulting copper electrolyte solution was introduced into a raw foil electrolysis equipment equipped with a rotating cathode roll and an insoluble anode. A current density ranging from 30 $A/dm^2$ to 60 $A/dm^2$ was applied to the cathode roll and the insoluble anode, respectively. Afterwards, the copper electrolyte solution was maintained at a temperature of 50° C. to 58° C., resulting in the production of a very low profile (VLP) raw foil, which was continuously wound onto a guiding roll.

Next, the VLP raw foil was conveyed at a production speed of 10 m/min by several guiding rolls into a continuous surface treatment device. It underwent surface treatments as specified in Tables 3-1, 3-2 and 3-3 to produce Copper foil 1 to Copper foil 10. The Rz and phosphorus content at the first surface of Copper foil 1 to Copper foil 10 were measured using the aforementioned testing methods, and the results are tabulated in Tables 3-1, 3-2 and 3-3.

TABLE 3-1

Treatment conditions and properties of Copper foil 1 to Copper foil 4

| Treatment time and conditions | | | Copper foil 1 | Copper foil 2 | Copper foil 3 | Copper foil 4 |
|---|---|---|---|---|---|---|
| Treatment tank | 1 | Electroplating time (second) | 0 | 0 | 0 | 0 |
| | 1A | Electroplating time (second) | 0 | 0 | 0 | 0 |
| | 2 | Electroplating time (second) | 0 | 0 | 0 | 0 |
| | 3 | Electroplating time (second) | 0 | 0 | 0 | 0 |
| | 4 | Electroplating time (second) | 0 | 0 | 0 | 0 |
| | 5 | Electroplating time (second) | 0 | 0 | 0 | 0 |
| | 6 | Electroplating time (second) | 0 | 0 | 0 | 0 |
| | 7 | Electroplating time (second) | 0 | 0 | 0 | 0 |
| | 8 | Electroplating time (second) | 0 | 0 | 0 | 0 |
| | 9 | Current density ($A/dm^2$) | 0.6 | 0.6 | 0.6 | 0.6 |
| | | Electroplating time (second) | 6.24 | 6.24 | 6.24 | 6.24 |
| | 10 | Current density ($A/dm^2$) | 0.6 | 0.6 | 0.6 | 0.6 |
| | | Concentration of phosphoric acid (g/L) | 0.2 | 0.2 | 0.2 | 0.1 |
| | | Electroplating time (second) | 2.25 | 2.25 | 2.25 | 2.25 |
| | 10A | Water rinsing time (second) | 1 | 1 | 1 | 1 |
| | | Amount of water flow (L/s) | 0.1 | 0.2 | 0.3 | 0.4 |
| | 11 | Immersed time (second) | 2 | 2 | 2 | 2 |
| Properties | | Rz (μm) | <0.5 | <0.5 | <0.5 | <0.5 |
| | | Phosphorus content ($\mu g/dm^2$) | 700 to 1000 | 500 to 699 | 200 to 499 | 100 to 199 |

TABLE 3-2

Treatment conditions and properties of Copper foil 5 to Copper foil 8

| Treatment time and conditions | | | Copper foil 5 | Copper foil 6 | Copper foil 7 | Copper foil 8 |
|---|---|---|---|---|---|---|
| Treatment tank | 1 | Electroplating time (second) | 0 | 0 | 0 | 0 |
| | 1A | Electroplating time (second) | 0 | 0 | 0 | 0 |
| | 2 | Electroplating time (second) | 0 | 0 | 0 | 0 |
| | 3 | Electroplating time (second) | 0 | 0 | 0 | 0 |
| | 4 | Electroplating time (second) | 0 | 0 | 0 | 0 |
| | 5 | Electroplating time (second) | 0 | 0 | 0 | 0 |
| | 6 | Electroplating time (second) | 0 | 0 | 0 | 0 |
| | 7 | Electroplating time (second) | 0 | 0 | 0 | 0 |
| | 8 | Electroplating time (second) | 0 | 0 | 0 | pure water*5 |
| | 9 | Current density ($A/dm^2$) | 0.6 | 0.6 | 0.6 | 0.6 |
| | | Electroplating time (second) | 6.24 | 6.24 | 6.24 | 6.24 |
| | 10 | Current density ($A/dm^2$) | 0.6 | 0.6 | 0.6 | 0.6 |
| | | Concentration of phosphoric acid (g/L) | 0.1 | 0.1 | 0.1 | 0 |
| | | Electroplating time (second) | 2.25 | 2.25 | 2.25 | 2.25 |
| | 10A | Water rinsing time (second) | 1 | 1 | 2 | 4 |
| | | Amount of water flow (L/s) | 0.5 | 1.0 | 1.5 | 1.5 |
| | 11 | Immersed time (second) | 2 | 2 | 2 | 2 |
| Properties | | Rz (μm) | <0.5 | <0.5 | <0.5 | <0.5 |
| | | Phosphorus content ($\mu g/dm^2$) | 30 to 99 | 10 to 29 | 1 to 9 | 0 |

*5 When treating Copper foil 8, the solution in treatment tank 8 is pure water rather than an electroplating solution.

TABLE 3-3

Treatment conditions and properties of Copper foil 9 and Copper foil 10

| Treatment time and conditions | | | Copper foil 9 | Copper foil 10 |
|---|---|---|---|---|
| Treatment tank | 1 | Current density ($A/dm^2$) | 44.12 | 44.12 |
| | | Electroplating time (second) | 2.4 | 2.4 |
| | 1A | Current density ($A/dm^2$) | 0 | 0 |
| | | Electroplating time (second) | 2.4 | 2.4 |
| | 2 | Current density ($A/dm^2$) | 29.41 | 29.41 |
| | | Electroplating time (second) | 3.6 | 3.6 |
| | 3 | Current density ($A/dm^2$) | 0 | 0 |
| | | Electroplating time (second) | 3.6 | 3.6 |
| | 4 | Current density ($A/dm^2$) | 29.41 | 29.41 |
| | | Electroplating time (second) | 2.4 | 2.4 |
| | 5 | Current density ($A/dm^2$) | 27.57 | 27.57 |
| | | Electroplating time (second) | 2.4 | 2.4 |

TABLE 3-3-continued

| Treatment conditions and properties of Copper foil 9 and Copper foil 10 | | | | |
|---|---|---|---|---|
| | Treatment time and conditions | | Copper foil 9 | Copper foil 10 |
| | 6 | Current density (A/$dm^2$) | 0 | 0 |
| | | Electroplating time (second) | 2.4 | 2.4 |
| | 7 | Current density (A/$dm^2$) | 11.03 | 11.03 |
| | | Electroplating time (second) | 3.6 | 3.6 |
| | 8 | Current density (A/$dm^2$) | 0 | 0 |
| | | Electroplating time (second) | 3.6 | 3.6 |
| | 9 | Current density (A/$dm^2$) | 0.6 | 0.6 |
| | | Electroplating time (second) | 6.24 | 6.24 |
| | 10 | Concentration of phosphoric acid (g/L) | 0.2 | 0.15 |
| | | Current density (A/$dm^2$) | 0.6 | 0.6 |
| | | Electroplating time (second) | 2.25 | 2.25 |
| | 10A | Water rinsing time (second) | 1 | 1 |
| | | Amount of water flow (L/s) | 0.2 | 0.5 |
| | 11 | Immersed time (second) | 2 | 2 |
| Property | | Rz (μm) | 1.25 | 1.25 |
| | | Phosphorus content (μg/$dm^2$) | 500 to 699 | 30 to 99 |

Preparation Example 1 for Adhesive Layer 40.0 g of non-perfluorinated resin SE-405 and 4.0 g of PFOA were mixed using a stirrer at room temperature. Water was added to serve as a solvent. The resultant mixture was stirred at room temperature and a rotational speed of 700 rpm for 15 to 20 minutes to obtain an adhesive material. The adhesive material was coated onto the first surface of a copper foil, followed by baking the coated copper foil at 160° C. for 3 minutes in an oven. Subsequently, the baked copper foil was removed to naturally cool to room temperature. Then, the copper foil was placed in a nitrogen oven and sintered at 380° C. for 15 minutes, resulting in Adhesive layer 1 formed on the copper foil. The thickness of Adhesive layer 1 is 6 μm.

Preparation Example 2 for Adhesive Layer 40.0 g of non-perfluorinated resin GK-570 and 4.0 g of PFOA were mixed using a stirrer at room temperature. Water was added to serve as a solvent. The resultant mixture was stirred at room temperature and a rotational speed of 700 rpm for 15 to 20 minutes to obtain an adhesive material. The adhesive material was coated onto the first surface of a copper foil, followed by baking the coated copper foil at 160° C. for 3 minutes in an oven. Subsequently, the baked copper foil was removed to naturally cool to room temperature. Then, the copper foil was placed in a nitrogen oven and sintered at 380° C. for 15 minutes, resulting in Adhesive layer 2 formed on the copper foil. The thickness of Adhesive layer 2 is 6 μm.

Preparation Example 3 for Adhesive Layer 40.0 g of perfluorinated resin D210 and 4.0 g of PFOA were mixed using a stirrer at room temperature. Water was added to serve as a solvent. The resultant mixture was stirred at room temperature and a rotational speed of 700 rpm for 15 minutes to 20 minutes to obtain an adhesive material. The adhesive material was coated onto the first surface of a copper foil, followed by baking the coated copper foil at 160° C. for 3 minutes in an oven. Subsequently, the baked copper foil was removed to naturally cool to room temperature. Then, the copper foil was placed in a nitrogen oven and sintered at 380° C. for 15 minutes, resulting in Adhesive layer 3 formed on the copper foil. The thickness of Adhesive layer 3 is 6 μm.

Preparation Example 4 for Adhesive Layer 40.0 g of perfluorinated resin 335D and 4.0 g of PFOA were mixed using a stirrer at room temperature. Water was added to serve as a solvent. The resultant mixture was stirred at room temperature and a rotational speed of 700 rpm for 15 to 20 minutes to obtain an adhesive material. The adhesive material was coated onto the first surface of a copper foil, followed by baking the coated copper foil at 160° C. for 3 minutes in an oven. Subsequently, the baked copper foil was removed to naturally cool to room temperature. Then, the copper foil was placed in a nitrogen oven and sintered at 380° C. for 15 minutes, resulting in Adhesive layer 4 formed on the copper foil. The thickness of Adhesive layer 4 is 6 μm.

Preparation of Copper Clad Laminate

Copper clad laminates of Examples 1 to 48 and Comparative Examples 1 to 68 were individually prepared according to the compositions as recited in Tables 4-1 to 4-3 using the following methods. Initially, multiple pieces of the dielectric layer were superimposed, and two sheets of copper foils (each 0.5 oz. and with adhesive layer formed thereon) were applied to the respective outermost layers. Subsequently, the assembled materials were placed in a hot press machine to undergo a high temperature hot-pressing. For PTFE dielectric layer 1 and PTFE dielectric layer 2, the hot-pressing conditions were as follows: heating to 380° C. at a heating rate of 5° C./min to 10° C./min, followed by hot-pressing at 380° C. for 7 hours to 9 hours under a full pressure of 30 kg/$cm^2$ (with an initial pressure of 5 kg/$cm^2$). For PPE dielectric layer and Epoxy dielectric layer, the hot-pressing conditions were as follows: heating to 200° C. to 220° C. at a heating rate of 2° C./min to 4° C./min, followed by hot-pressing at 200° C. to 220° C. for 2 hours under a full pressure of 18 kg/$cm^2$ (with an initial pressure of 8 kg/$cm^2$). The properties of the copper clad laminates of Examples 1 to 48 and Comparative Examples 1 to 68, including peeling strength, thermal resistance and anti-aging property, were tested according to the aforementioned testing methods. The results are tabulated in Tables 5-1 to 5-4.

TABLE 4-1

| Compositions of copper clad laminates of Examples 1 to 48 | | | | |
|---|---|---|---|---|
| | | Copper foil | Adhesive layer | Dielectric layer |
| Example | 1 | Copper foil 3 | Adhesive layer 1 | PTFE dielectric layer 1 |
| | 2 | Copper foil 4 | | |
| | 3 | Copper foil 5 | | |
| | 4 | Copper foil 6 | | |
| | 5 | Copper foil 7 | | |
| | 6 | Copper foil 8 | | |
| | 7 | Copper foil 3 | Adhesive layer 2 | |
| | 8 | Copper foil 4 | | |
| | 9 | Copper foil 5 | | |
| | 10 | Copper foil 6 | | |
| | 11 | Copper foil 7 | | |
| | 12 | Copper foil 8 | | |
| | 13 | Copper foil 3 | Adhesive layer 1 | PTFE dielectric layer 2 |
| | 14 | Copper foil 4 | | |
| | 15 | Copper foil 5 | | |
| | 16 | Copper foil 6 | | |
| | 17 | Copper foil 7 | | |
| | 18 | Copper foil 8 | | |
| | 19 | Copper foil 3 | Adhesive layer 2 | |
| | 20 | Copper foil 4 | | |
| | 21 | Copper foil 5 | | |
| | 22 | Copper foil 6 | | |
| | 23 | Copper foil 7 | | |
| | 24 | Copper foil 8 | | |
| | 25 | Copper foil 3 | Adhesive layer 1 | PPE dielectric layer |
| | 26 | Copper foil 4 | | |
| | 27 | Copper foil 5 | | |
| | 28 | Copper foil 6 | | |
| | 29 | Copper foil 7 | | |
| | 30 | Copper foil 8 | | |
| | 31 | Copper foil 3 | Adhesive layer 2 | |
| | 32 | Copper foil 4 | | |
| | 33 | Copper foil 5 | | |
| | 34 | Copper foil 6 | | |
| | 35 | Copper foil 7 | | |
| | 36 | Copper foil 8 | | |
| | 37 | Copper foil 3 | Adhesive layer 1 | Epoxy dielectric layer |
| | 38 | Copper foil 4 | | |
| | 39 | Copper foil 5 | | |
| | 40 | Copper foil 6 | | |
| | 41 | Copper foil 7 | | |
| | 42 | Copper foil 8 | | |
| | 43 | Copper foil 3 | Adhesive layer 2 | |
| | 44 | Copper foil 4 | | |
| | 45 | Copper foil 5 | | |
| | 46 | Copper foil 6 | | |
| | 47 | Copper foil 7 | | |
| | 48 | Copper foil 8 | | |

TABLE 4-2

| Compositions of copper clad laminates of Comparative Examples 1 to 48 | | | | |
|---|---|---|---|---|
| | | Copper foil | Adhesive layer | Dielectric layer |
| Comparative Example | 1 | Copper foil 3 | Adhesive layer 3 | PTFE dielectric layer 1 |
| | 2 | Copper foil 4 | | |
| | 3 | Copper foil 5 | | |
| | 4 | Copper foil 6 | | |
| | 5 | Copper foil 7 | | |
| | 6 | Copper foil 8 | | |
| | 7 | Copper foil 3 | Adhesive layer 4 | |
| | 8 | Copper foil 4 | | |
| | 9 | Copper foil 5 | | |
| | 10 | Copper foil 6 | | |
| | 11 | Copper foil 7 | | |
| | 12 | Copper foil 8 | | |
| | 13 | Copper foil 3 | Adhesive layer 3 | PTFE dielectric layer 2 |
| | 14 | Copper foil 4 | | |
| | 15 | Copper foil 5 | | |

TABLE 4-2-continued

| Compositions of copper clad laminates of Comparative Examples 1 to 48 | | | |
|---|---|---|---|
| | Copper foil | Adhesive layer | Dielectric layer |
| 16 | Copper foil 6 | | |
| 17 | Copper foil 7 | | |
| 18 | Copper foil 8 | | |
| 19 | Copper foil 3 | Adhesive layer 4 | |
| 20 | Copper foil 4 | | |
| 21 | Copper foil 5 | | |
| 22 | Copper foil 6 | | |
| 23 | Copper foil 7 | | |
| 24 | Copper foil 8 | | |
| 25 | Copper foil 3 | Adhesive layer 3 | PPE dielectric layer |
| 26 | Copper foil 4 | | |
| 27 | Copper foil 5 | | |
| 28 | Copper foil 6 | | |
| 29 | Copper foil 7 | | |
| 30 | Copper foil 8 | | |
| 31 | Copper foil 3 | Adhesive layer 4 | |
| 32 | Copper foil 4 | | |
| 33 | Copper foil 5 | | |
| 34 | Copper foil 6 | | |
| 35 | Copper foil 7 | | |
| 36 | Copper foil 8 | | |
| 37 | Copper foil 3 | Adhesive layer 3 | Epoxy dielectric layer |
| 38 | Copper foil 4 | | |
| 39 | Copper foil 5 | | |
| 40 | Copper foil 6 | | |
| 41 | Copper foil 7 | | |
| 42 | Copper foil 8 | | |
| 43 | Copper foil 3 | Adhesive layer 4 | |
| 44 | Copper foil 4 | | |
| 45 | Copper foil 5 | | |
| 46 | Copper foil 6 | | |
| 47 | Copper foil 7 | | |
| 48 | Copper foil 8 | | |

TABLE 4-3

| Compositions of copper clad laminates of Comparative Examples 49 to 68 | | | | |
|---|---|---|---|---|
| | | Copper foil | Adhesive layer | Dielectric layer |
| Comparative Example | 49 | Copper foil 1 | Adhesive layer 1 | PTFE dielectric layer 1 |
| | 50 | | Adhesive layer 2 | PTFE dielectric layer 1 |
| | 51 | | Adhesive layer 1 | PTFE dielectric layer 2 |
| | 52 | | Adhesive layer 2 | PTFE dielectric layer 2 |
| | 53 | | Adhesive layer 1 | PPE dielectric layer |
| | 54 | | Adhesive layer 2 | PPE dielectric layer |
| | 55 | | Adhesive layer 1 | Epoxy dielectric layer |
| | 56 | | Adhesive layer 2 | Epoxy dielectric layer |
| | 57 | Copper foil 2 | Adhesive layer 1 | PTFE dielectric layer 1 |
| | 58 | | Adhesive layer 2 | PTFE dielectric layer 1 |
| | 59 | | Adhesive layer 1 | PTFE dielectric layer 2 |
| | 60 | | Adhesive layer 2 | PTFE dielectric layer 2 |
| | 61 | | Adhesive layer 1 | PPE dielectric layer |
| | 62 | | Adhesive layer 2 | PPE dielectric layer |
| | 63 | | Adhesive layer 1 | Epoxy dielectric layer |
| | 64 | | Adhesive layer 2 | Epoxy dielectric layer |
| | 65 | Copper foil 9 | Adhesive layer 1 | PTFE dielectric layer 1 |
| | 66 | Copper foil 10 | Adhesive layer 1 | PTFE dielectric layer 1 |
| | 67 | Copper foil 9 | Adhesive layer 1 | PPE dielectric layer |
| | 68 | Copper foil 10 | Adhesive layer 1 | PPE dielectric layer |

TABLE 5-1

Properties of copper clad laminates of Examples 1 to 24

| | | Peeling strength (lbf/in) | Peeling strength representing thermal resistance (lbf/in) | Peeling strength representing anti-aging property (lbf/in) |
|---|---|---|---|---|
| Example | 1 | 3.10 | 2.89 | 2.83 |
| | 2 | 3.20 | 2.98 | 2.92 |
| | 3 | 3.20 | 2.98 | 2.92 |
| | 4 | 3.40 | 3.17 | 3.10 |
| | 5 | 3.40 | 3.17 | 3.10 |
| | 6 | 3.50 | 3.26 | 3.19 |
| | 7 | 3.72 | 3.47 | 3.39 |
| | 8 | 3.84 | 3.58 | 3.50 |
| | 9 | 3.84 | 3.58 | 3.50 |
| | 10 | 4.08 | 3.80 | 3.72 |
| | 11 | 4.08 | 3.80 | 3.72 |
| | 12 | 4.20 | 3.91 | 3.83 |
| | 13 | 3.00 | 2.80 | 2.73 |
| | 14 | 3.10 | 2.89 | 2.83 |
| | 15 | 3.20 | 2.98 | 2.92 |
| | 16 | 3.20 | 2.98 | 2.92 |
| | 17 | 3.30 | 3.07 | 3.01 |
| | 18 | 3.30 | 3.07 | 3.01 |
| | 19 | 3.60 | 3.35 | 3.28 |
| | 20 | 3.72 | 3.47 | 3.39 |
| | 21 | 3.84 | 3.58 | 3.50 |
| | 22 | 3.84 | 3.58 | 3.50 |
| | 23 | 3.96 | 3.69 | 3.61 |
| | 24 | 3.96 | 3.69 | 3.61 |

TABLE 5-2

Properties of copper clad laminates of Examples 25 to 48

| | | Peeling strength (lbf/in) | Peeling strength representing thermal resistance (lbf/in) | Peeling strength representing anti-aging property (lbf/in) |
|---|---|---|---|---|
| Example | 25 | 3.40 | 2.54 | 2.08 |
| | 26 | 4.40 | 3.29 | 2.70 |
| | 27 | 5.50 | 4.11 | 3.37 |
| | 28 | 6.30 | 4.71 | 3.86 |
| | 29 | 6.90 | 5.16 | 4.23 |
| | 30 | 6.80 | 5.09 | 4.17 |
| | 31 | 3.57 | 2.67 | 2.19 |
| | 32 | 4.62 | 3.46 | 2.83 |
| | 33 | 5.78 | 4.32 | 3.54 |
| | 34 | 6.62 | 4.95 | 4.05 |
| | 35 | 7.25 | 5.42 | 4.44 |
| | 36 | 7.14 | 5.34 | 4.38 |
| | 37 | 3.70 | 3.33 | 2.78 |
| | 38 | 4.00 | 3.60 | 3.00 |
| | 39 | 4.20 | 3.78 | 3.15 |
| | 40 | 4.50 | 4.05 | 3.38 |
| | 41 | 4.40 | 3.96 | 3.30 |
| | 42 | 4.50 | 4.05 | 3.38 |
| | 43 | 3.89 | 3.50 | 2.91 |
| | 44 | 4.20 | 3.78 | 3.15 |
| | 45 | 4.41 | 3.97 | 3.31 |
| | 46 | 4.73 | 4.25 | 3.54 |
| | 47 | 4.62 | 4.16 | 3.47 |
| | 48 | 4.73 | 4.25 | 3.54 |

TABLE 5-3

Properties of copper clad laminates of Comparative Examples 1 to 48

| | | Peeling strength (lbf/in) |
|---|---|---|
| Comparative Example | 1 | 1.10 |
| | 2 | 1.00 |
| | 3 | 1.10 |

TABLE 5-3-continued

Properties of copper clad laminates of Comparative Examples 1 to 48

| | | Peeling strength (lbf/in) |
|---|---|---|
| | 4 | 1.20 |
| | 5 | 1.10 |
| | 6 | 1.10 |
| | 7 | 0.90 |
| | 8 | 1.00 |
| | 9 | 1.20 |
| | 10 | 1.20 |
| | 11 | 0.90 |
| | 12 | 1.00 |
| | 13 | 1.00 |
| | 14 | 1.20 |
| | 15 | 1.20 |
| | 16 | 1.20 |
| | 17 | 1.00 |
| | 18 | 1.10 |
| | 19 | 1.00 |
| | 20 | 1.00 |
| | 21 | 1.30 |
| | 22 | 1.00 |
| | 23 | 0.90 |
| | 24 | 1.00 |
| | 25 | 2.30 |
| | 26 | 2.50 |
| | 27 | 2.60 |
| | 28 | 2.80 |
| | 29 | 2.50 |
| | 30 | 2.40 |
| | 31 | 1.50 |
| | 32 | 1.80 |
| | 33 | 2.10 |
| | 34 | 2.20 |
| | 35 | 2.00 |
| | 36 | 2.10 |
| | 37 | 0.50 |
| | 38 | 0.60 |
| | 39 | 0.60 |
| | 40 | 0.50 |
| | 41 | 0.60 |
| | 42 | 0.50 |
| | 43 | 1.10 |
| | 44 | 1.20 |
| | 45 | 1.00 |
| | 46 | 0.90 |
| | 47 | 0.90 |
| | 48 | 1.00 |

TABLE 5-4

Properties of copper clad laminates of Comparative Examples 49 to 68

| | | Peeling strength (lbf/in) | Peeling strength representing thermal resistance (lbf/in) | Peeling strength representing anti-aging property (lbf/in) |
|---|---|---|---|---|
| Comparative Example | 49 | 1.90 | 1.77 | 1.73 |
| | 50 | 2.28 | 2.12 | 2.08 |
| | 51 | 2.00 | 1.86 | 1.82 |
| | 52 | 2.40 | 2.24 | 2.19 |
| | 53 | 1.70 | 1.27 | 1.04 |
| | 54 | 1.79 | 1.34 | 1.09 |
| | 55 | 3.00 | 2.70 | 2.25 |
| | 56 | 3.15 | 2.84 | 2.36 |
| | 57 | 2.60 | 2.42 | 2.37 |
| | 58 | 3.12 | 2.91 | 2.84 |
| | 59 | 2.70 | 2.52 | 2.46 |
| | 60 | 3.24 | 3.02 | 2.95 |
| | 61 | 2.30 | 1.72 | 1.41 |
| | 62 | 2.42 | 1.81 | 1.48 |
| | 63 | 3.30 | 2.97 | 2.48 |
| | 64 | 3.47 | 3.12 | 2.60 |

TABLE 5-4-continued

Properties of copper clad laminates of Comparative Examples 49 to 68

| | Peeling strength (lbf/in) | Peeling strength representing thermal resistance (lbf/in) | Peeling strength representing anti-aging property (lbf/in) |
|---|---|---|---|
| 65 | 4.06 | 2.88 | 1.44 |
| 66 | 4.20 | 2.13 | 1.29 |
| 67 | 3.04 | 2.27 | 1.95 |
| 68 | 5.82 | 2.47 | 2.00 |

As shown in Tables 5-1 and 5-2, the copper clad laminates of the present invention have good peeling strength, thermal resistance and anti-aging property. Specifically, when employing identical adhesive and dielectric layers, the resulting copper clad laminate shows superior performance in peeling strength, thermal resistance and anti-aging properties when the phosphorus content at the first surface of the copper foil is lower. Particularly, if the phosphorus content at the first surface of the copper foil does not exceed 199 $\mu g/dm^2$, the resulting copper clad laminate exhibits further improvements in peeling strength, thermal resistance and anti-aging properties.

By contrast, as shown in Tables 5-3 and 5-4, the copper clad laminates not falling within the scope of the present invention exhibit poor peeling strength, thermal resistance and anti-aging properties. Specifically, when utilizing identical copper foil and dielectric layers, the resulting copper clad laminates shows notably deficient peeling strength if the adhesive layer comprises a perfluorinated resin rather than a non-perfluorinated resin. In addition, under identical adhesive and dielectric layers, the prepared copper clad laminate exhibits poor performance in peeling strength, thermal resistance and anti-aging properties when the phosphorus content at the first surface of the copper foil is higher than 499 $\mu g/dm^2$. Furthermore, when the Rz of the first surface of the copper foil is higher than 0.5 μm and the adhesive layer comprises a perfluorinated resin instead of a non-perfluorinated resin, the resulting copper clad laminate exhibits notably deteriorated thermal resistance and anti-aging properties.

The above examples are used to illustrate the principle and efficacy of the present invention and show the inventive features thereof, but are not used to limit the scope of the present invention. People skilled in this field may proceed with a variety of modifications and replacements based on the disclosures and suggestions of the invention as described. Therefore, the scope of protection of the present invention is that as defined in the claims as appended.

BRIEF DESCRIPTION OF NUMERAL REFERENCES

1: copper clad laminate
2, 6: copper foil
3, 5: adhesive layer
4: dielectric layer

What is claimed is:

1. A copper clad laminate, which comprises:

a dielectric layer;

an adhesive layer, which is disposed on at least one side of the dielectric layer and formed of an adhesive material, wherein the adhesive material comprises a non-perfluorinated resin; and a copper foil, wherein the copper foil has a first surface and is disposed on the other side of the adhesive layer opposite to the dielectric layer, and wherein the copper foil is adhered to the adhesive layer with the first surface, wherein the first surface has a ten-point average roughness (Rz) of less than 0.5 μm, and the copper foil is electroplated in such a way that the copper foil has a phosphorus content of no more than 499 $\mu g/dm^2$ at the first surface.

2. The copper clad laminate of claim 1, wherein the copper foil has a phosphorus content of no more than 199 $\mu g/dm^2$ at the first surface.

3. The copper clad laminate of claim 1, wherein the non-perfluorinated resin is selected from the group consisting of polychlorotrifluoroethylene, polyvinylidene difluoride, polyvinyl fluoride, an ethylene-tetrafluoroethylene copolymer, an ethylene-chloro-trifluoroethylene copolymer, and combinations thereof.

4. The copper clad laminate of claim 1, wherein the dielectric layer comprises a dielectric material formed from a resin composition.

5. The copper clad laminate of claim 4, wherein the resin composition comprises a thermosetting resin selected from the group consisting of an epoxy resin, a thermosetting phenolic resin with reactive functional groups, a thermosetting benzoxazine resin, a thermosetting polyphenylene ether resin, and combinations thereof.

6. The copper clad laminate of claim 4, wherein the resin composition further comprises a component selected from the group consisting of a catalyst, an elastomer, a filler, a dispersing agent, a toughener, a viscosity modifying agent, a flame retardant, a plasticizer, a coupling agent, and combinations thereof.

7. The copper clad laminate of claim 4, wherein the resin composition comprises a thermoplastic resin selected from the group consisting of a perfluorinated resin, a liquid crystal polymer, and a combination thereof.

8. The copper clad laminate of claim 7, wherein the perfluorinated resin is selected from the group consisting of polytetrafluoroethylene, polyfluoroalkoxy alkane, fluorinated ethylene propylene, and combinations thereof.

9. A printed circuit board, which is prepared from the copper clad laminate of claim 1.

10. The copper clad laminate of claim 1, wherein based on the total number of atoms in the repeating unit(s) of the non-perfluorinated resin, the number of fluorine atoms in the non-perfluorinated resin is no more than 60%.

11. The copper clad laminate of claim 10, wherein the non-perfluorinated resin is selected from the group consisting of polychlorotrifluoroethylene, polyvinylidene difluoride, polyvinyl fluoride, an ethylene-tetrafluoroethylene copolymer, an ethylene-chloro-trifluoroethylene copolymer, and combinations thereof.

12. The copper clad laminate of claim 10, wherein the dielectric layer comprises a dielectric material formed from a resin composition.

13. The copper clad laminate of claim 12, wherein the resin composition comprises a thermosetting resin selected from the group consisting of an epoxy resin, a thermosetting phenolic resin with reactive functional groups, a thermosetting benzoxazine resin, a thermosetting polyphenylene ether resin, and combinations thereof.

14. The copper clad laminate of claim 12, wherein the resin composition further comprises a component selected from the group consisting of a catalyst, an elastomer, a filler, a dispersing agent, a toughener, a viscosity modifying agent, a flame retardant, a plasticizer, a coupling agent, and combinations thereof.

15. The copper clad laminate of claim 12, wherein the resin composition comprises a thermoplastic resin selected from the group consisting of a perfluorinated resin, a liquid crystal polymer, and a combination thereof.

16. The copper clad laminate of claim 15, wherein the perfluorinated resin is selected from the group consisting of polytetrafluoroethylene, polyfluoroalkoxy alkane, fluorinated ethylene propylene, and combinations thereof.

17. A printed circuit board, which is prepared from the copper clad laminate of claim 10.

* * * * *